(12) United States Patent
Nakabayashi et al.

(10) Patent No.: US 6,876,682 B2
(45) Date of Patent: Apr. 5, 2005

(54) LIGHT GENERATING MODULE

(75) Inventors: Takashi Nakabayashi, Yokohama (JP); Atsushi Hamakawa, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 10/079,817

(22) Filed: Feb. 22, 2002

(65) Prior Publication Data

US 2002/0167977 A1 Nov. 14, 2002

(30) Foreign Application Priority Data

Feb. 23, 2001 (JP) .................................... P2001-048904

(51) Int. Cl.$^7$ ................................................ H01S 3/04
(52) U.S. Cl. ............................ 372/36; 372/43; 372/50
(58) Field of Search ............................. 372/50, 43, 36, 372/29.02; 257/433; 385/92, 93, 88, 49; 398/138

(56) References Cited

U.S. PATENT DOCUMENTS

| | | | | |
|---|---|---|---|---|
| 5,291,054 A | * | 3/1994 | Tanaka et al. ............... 257/433 |
| 5,526,160 A | * | 6/1996 | Watanabe et al. ........... 398/138 |
| 5,787,215 A | * | 7/1998 | Kuhara et al. ................ 385/88 |
| 5,845,031 A | * | 12/1998 | Aoki ............................. 385/92 |
| 6,021,149 A | * | 2/2000 | Miyazaki et al. ............. 372/50 |
| 6,071,016 A | * | 6/2000 | Ichino et al. .................. 385/92 |
| 6,155,724 A | * | 12/2000 | Ichino et al. .................. 385/92 |
| 6,273,620 B1 | * | 8/2001 | Kato et al. ..................... 385/88 |
| 6,374,021 B1 | * | 4/2002 | Nakanishi et al. ............ 385/49 |
| 6,456,641 B1 | * | 9/2002 | Hauer et al. .................. 372/50 |
| 6,459,710 B1 | * | 10/2002 | Whitney et al. ......... 372/29.02 |
| 6,488,419 B2 | * | 12/2002 | Kato et al. ..................... 385/93 |
| 6,603,782 B2 | * | 8/2003 | Nakanishi et al. ............ 372/36 |

OTHER PUBLICATIONS

"–d B m optical input power life test for InGaAsP EA modulator module", Technical Digest, Jul. 2000, Makuhari Messe, pp. 304–305.

* cited by examiner

*Primary Examiner*—Minsun Oh Harvey
*Assistant Examiner*—Dung (Michael) T Nguyen
(74) *Attorney, Agent, or Firm*—Smith, Gambrell & Russell, LLP (57) ABSTRACT

A light generating module 1 comprises a housing 2, a semiconductor light-emitting device 4, a driving element 6, and a monitoring light-receiving device 8. The monitoring light-receiving device 8 is optically coupled with the semiconductor light-emitting device 4. The driving element 6 drives the semiconductor light-emitting device 4. The housing 2 contains the semiconductor light-emitting device 4, the driving element 6, and the monitoring light-receiving device 8. These elements 4, 6, and 8 are disposed sequentially along a predetermined axis. The driving element 6 is disposed between the semiconductor light-emitting device 4 and the monitoring light-receiving device 8. This configuration makes it possible to dispose the driving element 6 close to the semiconductor light-emitting device 4 so as to achieve a transmission rate of 10 Gbps without degrading the optical coupling between the semiconductor light-receiving device 8 and the semiconductor light-emitting device 4.

20 Claims, 7 Drawing Sheets

Fig.7B mission rate
LIGHT GENERATING MODULE

BACKGROUND OF THE INVENTION

1. Field of the Invention

The present invention relates to a light generating module.

2. Description of the Related Art

A semiconductor light generating modules comprises a semiconductor laser element, a photodiode for monitoring, and a butterfly-type package. The aforementioned package contains the semiconductor laser element and the monitoring photodiode therein. The monitoring photodiode receives light from the semiconductor laser element. The butterfly-type package has a plurality of lead terminals. Through these lead terminals, the semiconductor laser element receives driving signals.

SUMMARY OF THE INVENTION

The inventors have researched light generating modules that can achieve transmission rates of 10 Gbps or more. The inventors understand that the operating speed of the drive element itself is important to achieve desired transmission rates in the order of 10 Gbps. In the research conducted by the inventors to this point, the inventors have discovered that, in addition to the importance of the drive element, the transmission of the signal from the driving element to the semiconductor light-emitting device is important along with the transmission of the driving signal to the driving element.

In order to provide a semiconductor light-emitting element in which the quality of the high-speed modulation signal is not degraded, it is important to arrange the driving element and the semiconductor light-emitting device in proximity to each other. In order to achieve a transmission rate of 2.5 Gbps, the distance between the driving element and the semiconductor light-emitting device is required to be not more than 1.5 cm. In order to loosen this technical requirement, light generating modules operable at a transmission rate of 2.5 Gbps is required to connect the driving element to the semiconductor light-emitting device with transmission leads of an impedance of 50Ω, and to provide an impedance-matching resistance in proximity to the semiconductor light-emitting device.

In order to achieve a transmission speed of 10 Gbps, the distance between the driving element and the semiconductor light-emitting device has to be not more than 2 to 3 mm. Consequently, even when using a 50Ω impedance transmission line and a impedance matching resistance, it is difficult to obtain a board bandwidth sufficient for transmission rates of 10 Gbps.

In contrast to the configuration described above, the inventors think that another configuration of a optical module in which the distance between the driving element and the semiconductor light-emitting device is not more than 1 mm. With no impedance matching resistance, the shorter the distance between the driving element and the semiconductor light-emitting device, the more preferable it is to make high-speed transmissions. In other words, it is important to arrange the drive element and the semiconductor light-emitting device in proximity to each other in order to improve the transmission speed. The photodiode is, however, disposed adjacent to the semiconductor light-emitting device. The inventors have researched structures in which the driving element and the semiconductor light-emitting device are arranged in proximity to each other so that the light generating module achieves a transmission rate of 10 Gbps as well as the optical coupling between the semiconductor light-emitting device and the monitoring photodiode.

It is an object of the present invention to provide a light generating module having a structure in which the driving element and the semiconductor light-emitting device can be provided adjacent to each other.

The light generating module of the present invention comprises a semiconductor light-emitting element, a monitoring light-receiving element, a driving element, and a housing. The monitoring light-receiving element is optically coupled to the semiconductor light-emitting device. The driving element is provided in a region of the light generating device between a region therein in which the semiconductor light-emitting device is provided and a region thereof in which the monitoring light-receiving element is provided, and the driving element drives the semiconductor light-emitting device. The housing contains the semiconductor light-emitting device, the driving element, and the monitoring light-receiving element. These elements are provided in this order along a predetermined reference surface.

The driving element is provided between the semiconductor light-emitting device and the monitoring light-receiving element. In this arrangement, the driving element and the semiconductor light-emitting device are provided in proximity to each other.

The light generating module according to the present invention further comprises a first mounting member and a second mounting member. The first mounting member has first, second, and third regions arranged sequentially along a predetermined axis. The second mounting member has a support surface on which the monitoring light-receiving element is provided. The monitoring light-receiving element has a light-detection region capable of detecting light. The semiconductor light-emitting device is provided on the first region of the first mounting member. The driving element is provided on the second region of the first mounting member. The second mounting member is provided on the third region of the first mounting member. The semiconductor light-emitting device has a pair of facets and an active layer that extends from one of the pair of facets to the other. The region in the housing is divided into first and second sections by a plane extending along the active layer. The driving element is provided in the second section.

In the light generating module, the light-receiving region of the monitoring light-receiving element is positioned in the first section. The entire photo-detecting region positioned in the first section can be optically coupled to the semiconductor light-emitting device.

In the light generating module, the photo-detecting region of the monitoring light-receiving element has first and second portions, where the first portion of the photo-detecting region is positioned in the first section, and the second portion of the photo-detecting region is positioned in the second section. According to this configuration, the first portion of the photo-detecting region can be optically coupled to the semiconductor light-emitting device, and the second portion of the photo-detecting region contributes to the detection of light.

In the light generating module, the housing has a plurality of side walls. The semiconductor light-receiving element is provided between one of the plurality of side walls and the driving element. The light-emitting element may further comprise a substrate provided between the side wall of the housing and the driving element. This substrate has a transmission line for transmitting a modulation signal to the driving element. The transmission line is electrically connected to the driving element. Since the substrate is provided between the side wall of the housing and the driving element, the driving element receives a signal through the transmission line even when the semiconductor light-receiving element is provided within the housing.

In this light generating module, since the transmission line is provided on a surface made of an AlN material, the transmission line exhibits superior high frequency transmission characteristics. The transmission line can include a micro-strip line. Alternatively, the transmission line can include coplanar line.

In the light generating module, the second mounting member is provided on the substrate, and the second mounting member is provided apart from the transmission line. Since the transmission line is separated from the second mounting member, the second mounting member is unlikely to interfere with signals on the transmission line.

The light generating module may further comprise an optical fiber provided along the predetermined axis. The optical fiber has one end optically coupled with the semiconductor light-emitting device. Light is generated by the semiconductor light-emitting device and is extracted from the light generating module through the optical fiber. Consequently, the light generating module has a structure in which the optical fiber, the semiconductor light-emitting device, the driving element, and the light-receiving element for driving are arranged in order in a direction of the predetermined axis.

In the light generating module, the optical fiber can comprise a grating provided at a predetermined distance from one end thereof, and the semiconductor light-emitting device can include a semiconductor optical amplifier. Consequently, the semiconductor light generating module works as a fiber grating semiconductor light generating module having a driving element for driving a semiconductor optical amplifier.

In the light generating module, the semiconductor light-emitting device can include a semiconductor laser element, thus providing a semiconductor laser module. Consequently, the semiconductor light generating module works as a semiconductor laser module having a driving element for driving a semiconductor laser element.

The aforementioned object, other objects, features, and advantages of the present invention will be more easily understood from detailed description given below of preferred embodiments of the present invention, with reference to accompanying drawings that are shown only as examples.

DESCRIPTION OF THE PREFERRED EMBODIMENTS

Embodiments of the present invention will be described below with reference to the drawings. If possible, identical parts are labeled with identical reference symbols.

(First Embodiment)

Figure 1:
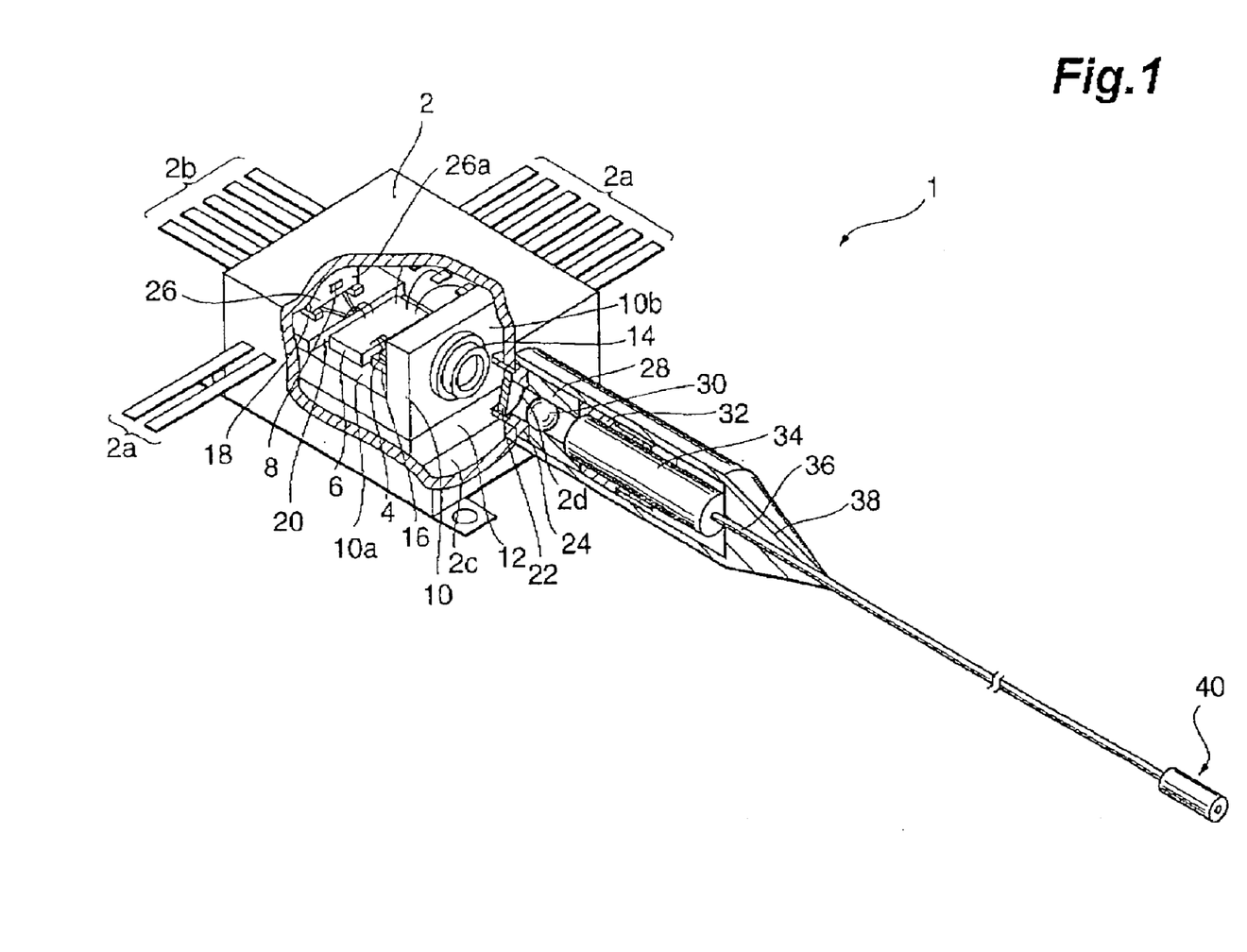
FIG. 1 is a drawing showing a light generating module in an embodiment of the present invention.

FIG. 1 shows a light generating module according to an embodiment of the present invention. The light generating module 1 comprises a housing 2, semiconductor light-emitting device 4, a semiconductor driving element 6, and a semiconductor light-receiving device 8. The housing 2 has a pair of side wall portions extending in a direction of a predetermined axis, and back and front wall portions intersecting with the predetermined axis. Each of the side wall portions has a plurality of lead terminals 2a, and the back wall portion has a plurality of lead terminals 2b.

The housing 2 contains the semiconductor light-emitting device 4, the semiconductor driving element 6, and the semiconductor light-receiving device 8 therein. The semiconductor light-emitting device 4 generates light modulated in response to a modulation signal. The semiconductor light-emitting device 4 may be, for example, a semiconductor laser element, or the semiconductor light-emitting device 4 may he a semiconductor integrated laser element having an electric-field absorption (EA) type optical modulator and a semiconductor laser. Examples of the semiconductor laser are as follows: DFB semiconductor lasers; Fabry-Perot semiconductor lasers. The semiconductor light-receiving device 8 monitors the emission of light from the semiconductor light-emitting device 4. The semiconductor light-receiving device 8 converts received light into an electric current, and can be, for example, a photodiode. The semiconductor driving element 6 receives the modulation signal through the lead terminal 2b. The modulation signal is used for modulating the semiconductor light-emitting device 4. The semiconductor driving element 6 amplifies the modulation signal to produce a drive signal. The drive signal is supplied to the semiconductor light-emitting device 4. If the semiconductor light-emitting device 4 is the above optical integrated element, the modulation signal is applied to the EA-type optical modulator.

A first mounting member 10 is provided on the bottom surface 2c of the housing 2. The first mounting member 10 is made of a conductive material, such as metal. The first mounting member 10 is supported by the support member 12. The first mounting member 10 has a mounting surface 10a and a lens supporting portion 10b. The lens supporting portion 10b supports a first lens support member 14. The first lens support member 14 holds the first lens (42 in FIG. 2).

The semiconductor light-emitting device 4, semiconductor driving element 6, and semiconductor light-receiving device 8 are mounted on the mounting surface 10a, and these elements are arranged in a direction of the predetermined axis. The semiconductor driving element 6 is provided between the semiconductor light-emitting device 4 and the semiconductor light-receiving device 8. The semiconductor light-emitting device 4 is mounted on a second mounting member 16, such as a submount. The second mounting member 16 is provided on the mounting surface 10a. The submount is made from, for example, a material exhibiting a good thermal conductivity. The semiconductor driving element 6 is mounted directly on the mounting surface 10a. The semiconductor light-receiving device 8 is disposed on the mount surface 26a of a third mounting member 26, whereby the light-receiving surface of the semiconductor light-receiving device 8 is disposed so as to be optically coupled to the semiconductor light-emitting device 4. The third mounting member 26 is made of a dielectric material, such as alumina. The third mounting member 26 includes a pair of support parts, and the mounting member 26 is supported by a pair of support members 18 such that the plane containing the support surface 26a of the mounting member 26 intersects with the predetermined axis. Each of the pair of supporting members 18 is provided on a wiring substrate 20. The support members 18 are made from an insulating material, such as AlN, or made from metal, such as kovar. The wiring substrate 20 is made of an insulating material, such as AlN.

The front wall of the housing 2 is provided with the lens support member 10b of the first mounting member 10. The front wall is provided with a hole 2d through which light from the semiconductor light-emitting device 4 passes. The holding member 24 is provided in the hole 2d, and the holding member 24 holds a hermetic glass 22. One end of a second lens holding member 28 is aligned with the holding member 24 and is provided at the outer side of the front wall portion of the housing 2. The second lens holding member 28 holds a lens 30, such as a condensing lens. A ferrule holder 32 is provided on the other end of the second lens holding member 28. The ferrule holder 32 has a hole for accepting the ferrule 34 therein. An optical fiber 36 is inserted into the ferrule 34 so as to protect one end part of the optical fiber 36. The optical fiber 36 is aligned with the lens 30 through the ferrule 34 and the ferrule holder 32, whereby light from the semiconductor light-emitting device 4 is incident on one end of the optical fiber 36. The protecting member 38 covers the second lens holding members 28, the ferrule holding member 32, and the ferrule 34. The protecting member 38 can be a rubber cap. The optical fiber 36 extends to external of the housing through the protecting member 38. An optical connecting device 40, such as an optical connector, is equipped on the other end of the optical fiber 36. The optical coupling device 40 provides light coming from the semiconductor light-emitting device 4 through the optical fiber 34. In the present embodiment, the optical coupling device 40 includes the ferrule that is installed on the other end of the optical fiber 36.

Figure 2A:
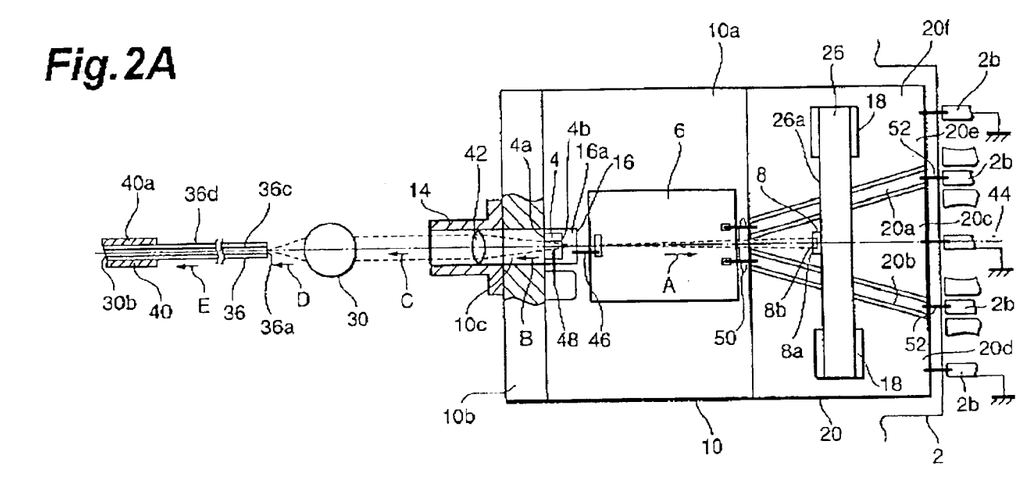
FIG. 2A is a top view showing electrical coupling and optical coupling between electronic and optical elements included in the light generating module shown in FIG. 1.
Figure 2B:
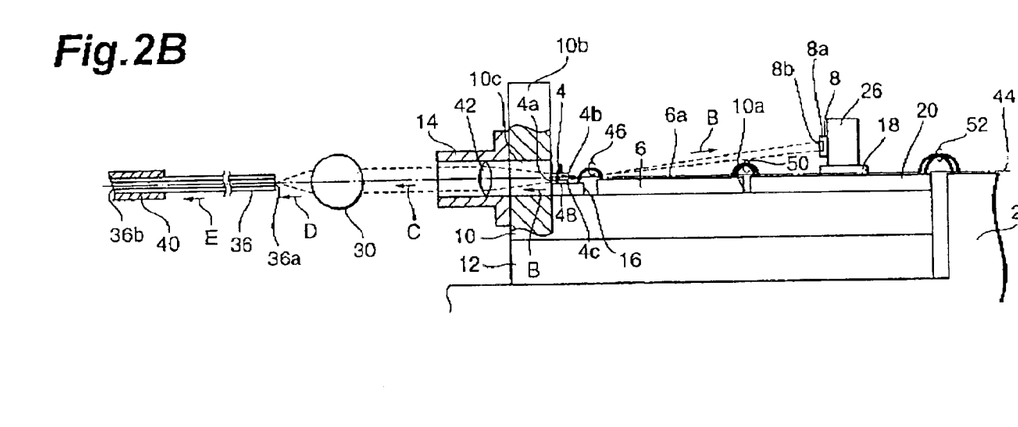
FIG. 2B is a side view showing electrical coupling and optical coupling between electronic and optical elements included in the light generating module shown in FIG. 1.

FIG. 2A is a top view showing the electrical and optical couplings between the electronic element and the optical elements included in the light generating module 1, and FIG. 2B is a side view showing the electrical and optical coupling between the electronic element and optical elements included in the light generating module 1.

Referring to FIG. 2A, the optical fiber 36, the lens 30, the lens 42, the semiconductor light-emitting device 4, the semiconductor driving element 6, and the semiconductor light-receiving device 8 are arranged in a direction of a predetermined axis 44. The semiconductor light-emitting device 4 is optically coupled to the optical fiber 36 through the lens 30 and the lens 42. The semiconductor light-emitting device 4 has a light-emitting surface 4a and a light-reflecting surface 4b. The light-emitting surface 4a and the light-reflecting surface 4b form the optical cavity in the light generating module 1. The light-reflecting surface 4b faces the light-receiving surface 8a of the semiconductor light-receiving device 8. The light A arrives at the light-receiving surface 8a from the light-reflecting surface 4b of the semiconductor light-emitting device 4, and generates carriers in the light-absorbing region 8b. The light B is provided from the light-emitting surface 4a of the semiconductor light-emitting device 4 and arrives at the lens 42, such as the collimating lens, after passing through the hole 10c provided in the lens holding member 10b. The lens 42 changes the propagating direction of the light B to form light propagating in a direction of the predetermined axis 44. The light C arrives at the lens 30, such as the condensing lens. The lens 30 changes the propagation direction of the light C to form a light D directed towards the one end 36a of the optical fiber 36. The light D is introduced into the optical fiber 36 to become light E, and the light E propagates through a core part 36c that is covered on its side surfaces by a clad part 36d. The light E arrives at the other end 36b of the optical fiber 36 and is provided to another optical coupling device (not shown) through an optical coupling device 40.

The semiconductor light-emitting device 4 is mounted onto the mounting surface 10a of the first mounting member 10 through the second mounting member 16. One electrode of the semiconductor light-emitting device 4 is connected electrically to the power supply line through a bonding wire 48. The other electrode of the semiconductor light-emitting device 4 is connected electrically to the semiconductor driving element 6 through a bonding wire 46. The bonding wire 46 is disposed so as to avoid an optical path from the semiconductor light-emitting device 4 to the semiconductor light-receiving device 8. According to experiments conducted by the inventors, achieving a high speed transmission at a rate of 10 Gbps requires a distance between the semiconductor driving element 6 and the second mounting member 16 to be not more than 1 mm. The semiconductor driving element 6 has a pair of sides, where one side of the pair of sides faces the semiconductor light-emitting device 4, and the other side thereof faces the substrate 20. The substrate 20 has a wiring surface 20f. A pair of transmission lines 20a and 20b is provided on the wiring surface 20f so as to extend from one side of the pair of sides to the other. Along each of these transmission lines 20a and 20b are provided electrically conductive layers 20c, 20d, and 20e. The electrically conductive layers 20c, 20d, and 20e are connected to a ground line. One end of each of the transmission lines 20a and 20b is connected electrically to the semiconductor driving element 6 through a bonding wire 50. The other end of each of the transmission lines 20a and 20b is connected electrically to a lead terminal 2b of the housing 2 through a bonding wire 52. One end of each of the transmission lines 20a and 20b is positioned at a side, faced to one edge of the semiconductor driving element 6, of the substrate. The other end of each of the transmission lines 20a and 20b is positioned at a side, faced to the lead terminal 2b, of the substrate. The transmission lines 20a and 20b are provided so as to extend in a direction of the predetermined axis 44, and, preferably, are provided so as to extend in respective straight lines connecting both sides of the substrate. The transmission lines 20a and 20b are provided to form a electrically symmetrical fashion.

Referring to FIG. 2B, the optical fiber 36, the lens 30, the lens 42, and the semiconductor light-emitting device 4 are arranged with respect to the predetermined axis 44. The semiconductor light-emitting device 4 has an active layer 4c that generates light in response to carrier injection. A reference plane extends in the active layer 4c, and the active layer 4c is provided so as to extend along the reference plane. The reference plane is determined so as to include the axis 44 thereon. In FIG. 2B the axis 44 is completely on the reference plane. This reference plane divides the region within the housing 2 into two sections. The semiconductor driving element 6 is provided in one of these sections. The light-receiving region 8b is positioned in the other section, and, preferably, the semiconductor light-receiving device 8 is positioned in the other section. In this arrangement, any straight line that connects the light-emitting region of the active layer 4c of the semiconductor light-emitting layer 4 to the light-receiving region 8b does not intersect with the element surface 6a of the semiconductor driving element 6. The arrangement ensures that the semiconductor light-receiving device 8 is coupled optically to the light-emitting device 4. In the arrangement, it is possible to dispose the semiconductor driving element 6 in proximity to the semiconductor light-emitting device 4.

Figure 3A:
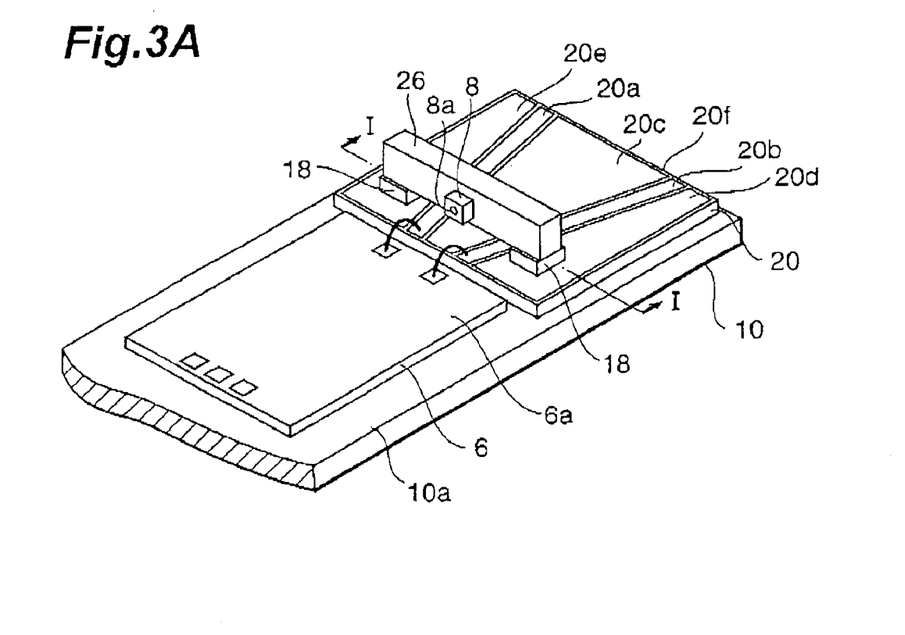
FIG. 3A is a view showing the arrangement of the semiconductor driving element, the semiconductor light-receiving element, and the substrate.

FIG. 3A is a view showing the arrangement of the semiconductor driving element 6, the semiconductor light-receiving device 8, and the substrate 20. The third mounting member 26 is supported by a pair of support members 18. The support members 18 provide a gap under the third support member 26, and the transmission lines 20a and 20b pass through this gap. The transmission lines 20a and 20b can be, for example, microstrip lines provided on the wiring surface 20f. If the transmission lines 20a and 20b are microstrip lines, the interval between the microstrip lines is narrowed, thereby advantageously shortening the length of the connection wire to the input pad of the semiconductor driving element 6. Alternatively, the transmission lines 20a and 20b can be, for example, coplanar lines provided on the wiring surface 20f. In coplanar lines, the interval between the coplanar lines is narrowed, thereby advantageously shortening the length of the connection wire to the input pad of the semiconductor driving element 6. According to findings of the inventors, coplanar lines are preferable to microstrip lines in the light generating module of to this embodiment. These transmission lines preferably have a characteristic impedance of 50Ω.

Figure 3B:
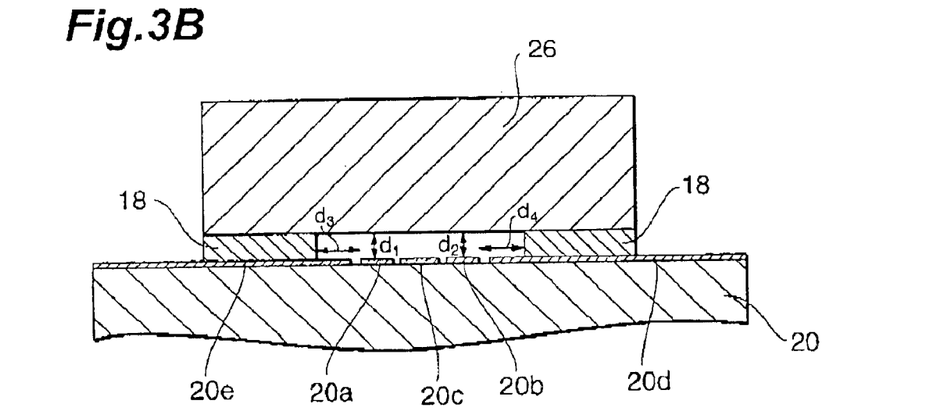
FIG. 3B is a cross-sectional view taken along a I—I line shown in FIG. 3A.

FIG. 3B is a cross-sectional view taken along a I—I line of FIG. 3A. The respective distances $d_1$ and $d_2$ between the third mounting member 26 and the transmission lines 20a and 20b is preferably not less than 100 µm. According to experiments conducted by the inventors, it is possible to reduce the level of the electromagnetic interference caused by the third mounting member 26 to the transmission lines 20a and 20b, thereby reaching this interference to a level at which it can be put into practical use. The distances $d_3$ and $d_4$ between the support members 18 and the transmission paths 20a and 20b are preferably not less than 100 µm. According to experiments conducted by the inventors, the distances make it possible to reduce the electromagnetic interference to the transmission lines 20a and 20b from the support members 18, thereby reaching this interference to a level at which it can be put into practical use.

Figure 4:
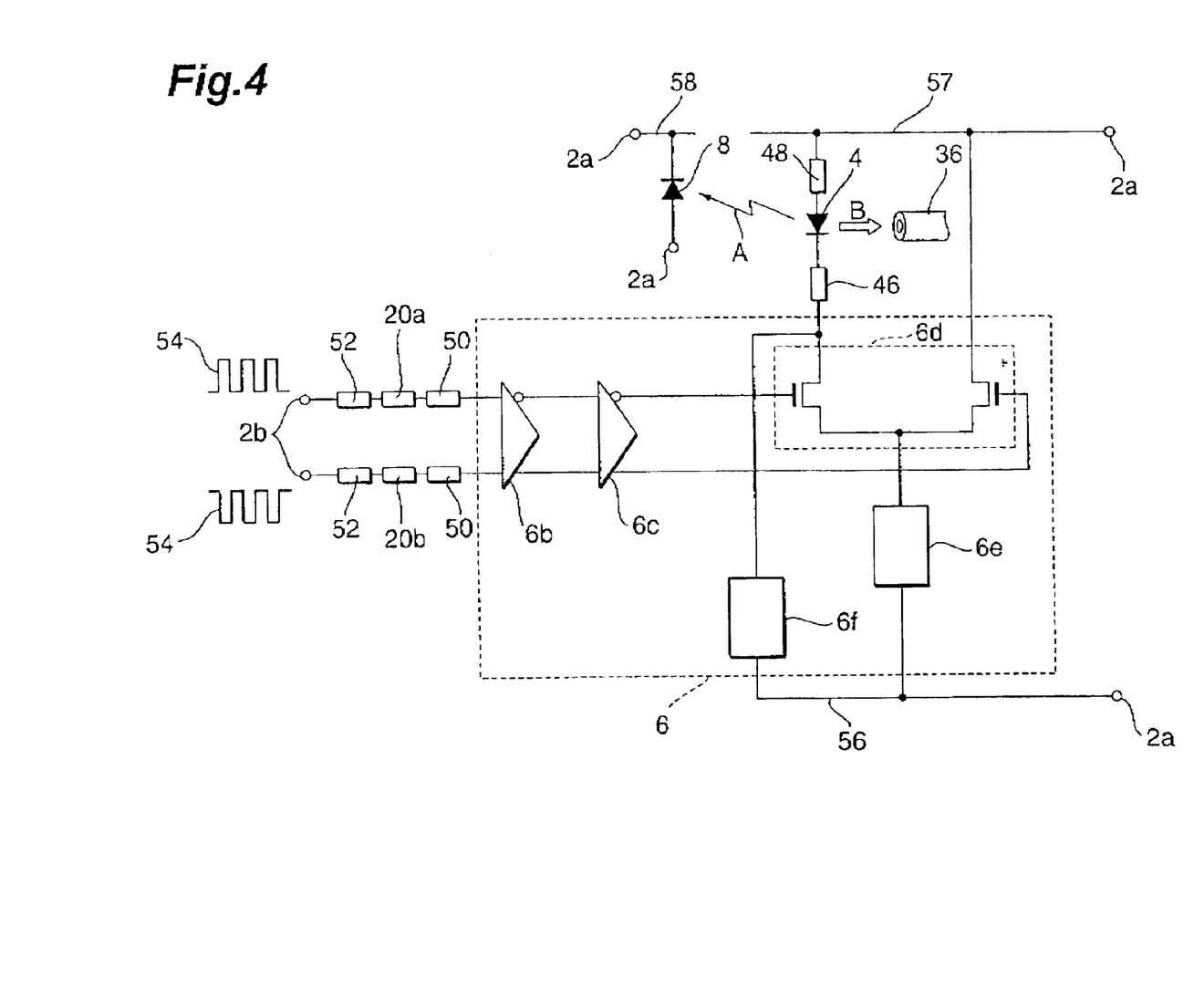
FIG. 4 is a view showing the equivalent circuit of the light generating module.

FIG. 4 is a view showing the equivalent circuit of the electronic elements included in the light generating module 1. The semiconductor driving element 6 receives the modulation signals 54, applied to the light generating module 1, of 10 Gbps transmission rates through the lead terminals 2b. The modulation and complimentary signals 54 are provided to the input terminals of the semiconductor driving element 6 from the lead terminals 2b through impedances 52, 20a, 20b, and 50. The semiconductor driving element 6 has an amplifier circuit 6b and a drive circuit 6c. The amplifier circuit 6b and drive circuit 6c are provided for processing the modulation signals 54, and these modulation signals 54 are applied to a differential transistor pair 6d through the amplifier circuit 6b and the drive circuit 6c.

The differential transistor pair 6d, having a common node, is constituted by a pair of transistors. The common node of the differential transistor pair 6d is connected to a current source 6e provided between the common node and the reference voltage line 56. One of the nodes of the differential transistor pair 6d is connected through an impedance element 46 to one terminal of the transistor light-emitting device 4 (for example, the cathode of a semiconductor laser element). The other terminal of the semiconductor light-emitting device 4 (for example, the anode of a semiconductor laser element) is connected through an impedance element 48 to the power supply line 57 prepared for the light-emitting element. The other of the differential transistor pair 6d is connected to the power supply line 57. With these connections, the semiconductor light-emitting device 4 operates according to the modulation signals to produce an optical signal. The optical signal B is provided to the optical fiber 36.

The bias current circuit 6f is provided between one terminal of the semiconductor light-emitting device 4 and the reference voltage line 56, and is connected thereto. The bias current circuit 6f provides, to one terminal of the semiconductor light-emitting device 4, a bias current for specifying the operating point of the semiconductor light-emitting device 4. The semiconductor driving element 6 receives a number of control signals (not shown) through the lead terminal 2a, but explanations therefor will not be given.

The monitoring semiconductor light-receiving device 8 is optically coupled to the semiconductor light-emitting device 4. The semiconductor light-receiving device 8 receives monitoring light A from the semiconductor light-emitting device 4. One terminal of the semiconductor light-receiving device 8 (for example, the cathode of a photodiode) is connected to the power supply line 58 for the light-receiving element. The other terminal of the semiconductor light-receiving device 8 (for example, the anode of a photodiode) is connected to a lead terminal 1a.

As can be seen from the explanation thus far, the semiconductor driving element 6 and the semiconductor light-emitting 4 can be arranged adjacent to each other by a distance of several hundred microns or shorter, thus providing the light generating module 1, which is able to make high speed transmissions.

(Second Embodiment)

Figure 5:
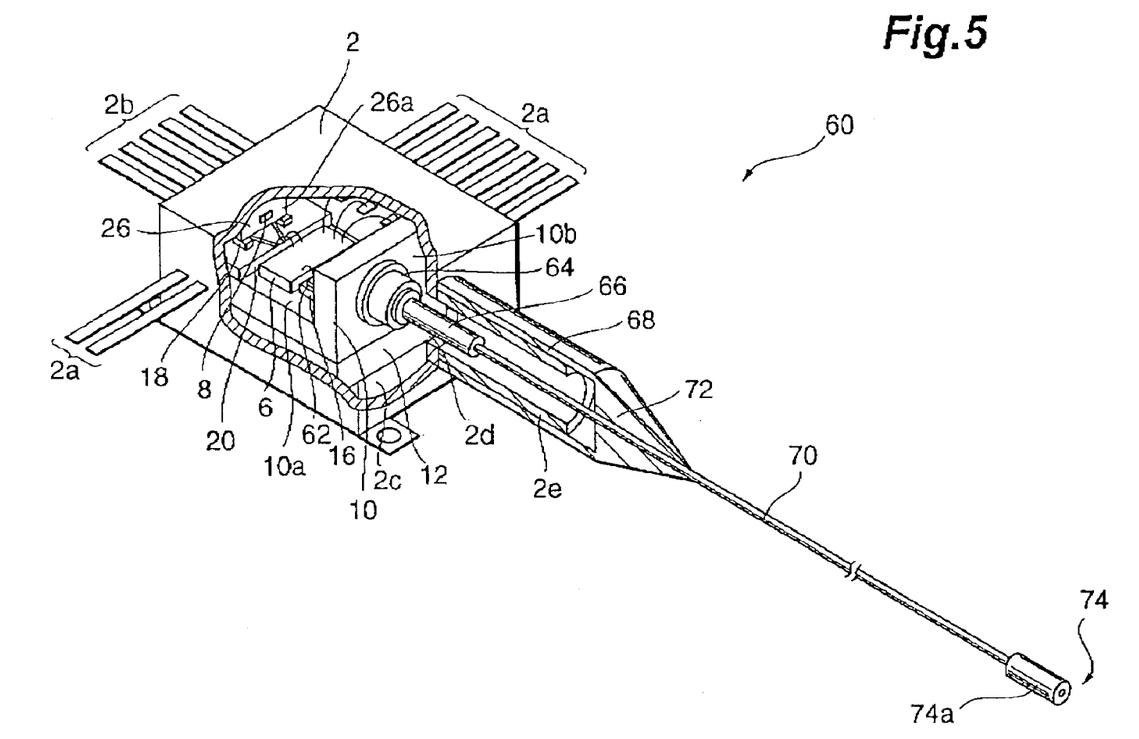
FIG. 5 is a view showing a light generating module according to another embodiment of the present invention.

FIG. 5 shows a light generating module according to another embodiment of the present invention. A light generating module 60 comprises a housing 2, a semiconductor light-emitting element 62, a semiconductor driving element 6, and a semiconductor light-receiving device 8. The housing 2, the semiconductor driving element 6, and the semiconductor light-receiving device 8 each has the same form as in the embodiment shown in FIG. 1, and thus the detailed explanations therefor are omitted, but these are not limited to those in the first embodiment. In the second embodiment, the semiconductor light-element 62 can be, for example, a semiconductor optical amplifier.

The first mounting member 10 has a mounting surface 10a and a lens supporting member 10b. The semiconductor light-emitting device 62, the semiconductor driving element 6, and the semiconductor light-receiving device 8 are mounted on the mounting surface 10a, and are arranged along a predetermined axis. The semiconductor driving element 6 is provided between the semiconductor light-emitting device 62 and the semiconductor light-receiving device 8. The semiconductor light-emitting device 62 is mounted on the second mounting member 16. A positioning part 64 is disposed on the side surface of the lens support member 10b. The positioning part 64 is used to optically couple an optical fiber 70 to a semiconductor optical amplifier 62. The optical fiber 70 is inserted into a ferrule 66 to protect one end portion of the optical fiber 70. The positioning part 64 holds the ferrule 66.

The front wall portion of the housing 2 is faced to the lens support member 10b of the first mounting member 10. The front wall portion is provided with a hole 2d through which light from the semiconductor light-element 4 passes. A light guide member 2e having a tubular shape is provided at the position of the hole 2d. A protecting member 72 covers the light guide member 2e. The protecting member 72 can be a rubber cap. The optical fiber 70 passes through the protecting member 72 and extends out of the housing 2. An optical coupling device 74, such as an optical connector, is installed on the other end 70b of the light fiber 70. The optical coupling device 74 provides light from the light-emitting 62 coming from the optical fiber 70. In this embodiment, the optical coupling device 74 includes, for example, a ferrule 74a installed on the other end 70b of the optical fiber 70.

Figure 6A:
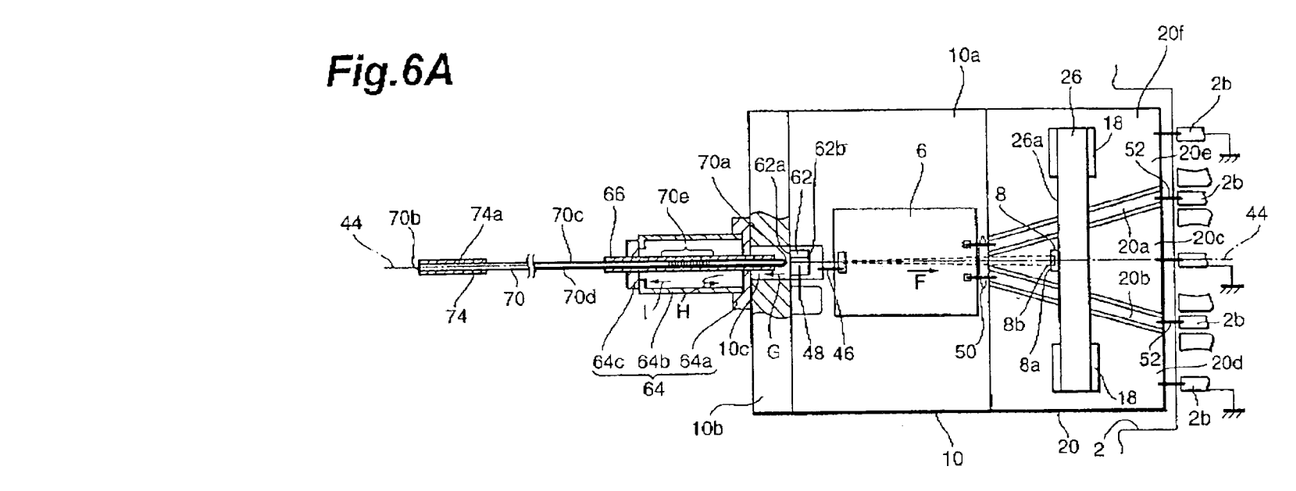
FIG. 6A is a top view showing electrical coupling and optical coupling between electronic and optical elements included in the light generating module shown in FIG. 5.
Figure 6B:
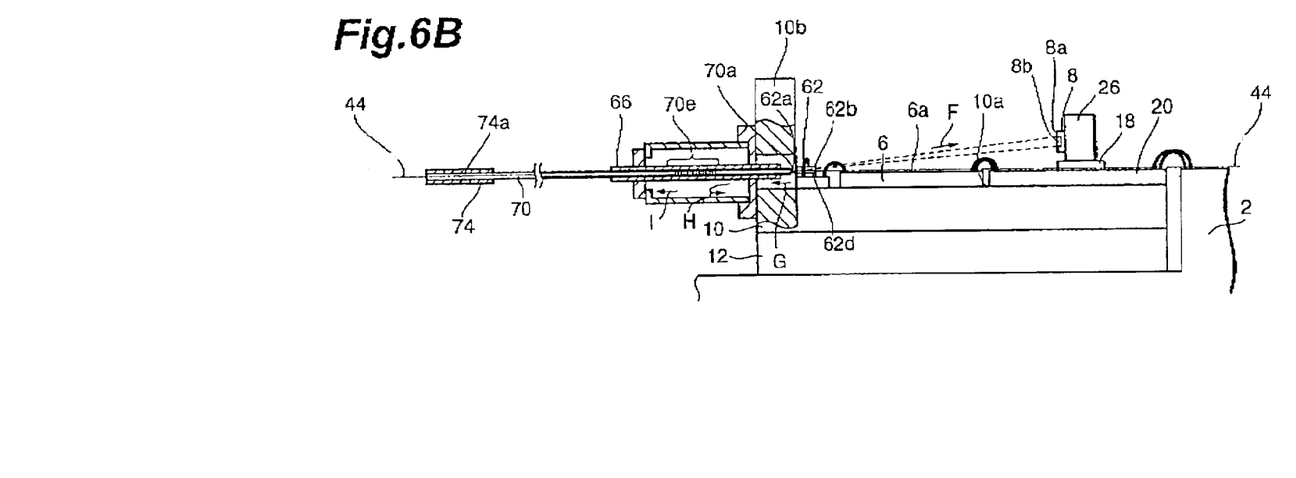
FIG. 6B is a side view showing electrical coupling and optical coupling between electronic and optical elements included in the light generating module shown in FIG. 5.

FIG. 6A is an top view showing the electrical coupling and optical coupling between the electronic elements and optical elements included in the light generating module 60, and FIG. B is a side view showing the electrical coupling and optical coupling between the electronic elements and optical elements included in the light generating module 60.

Referring to FIG. 6A, an optical fiber 70, a semiconductor light-emitting element 62, a semiconductor driving element 6 and a semiconductor light-receiving device 8 are arranged in a direction of the predetermined axis 44. The semiconductor light-emitting device 62 is optically coupled to the lensed end portion 70a of the optical fiber 70. The optical fiber 70 has a grating 70e therein at a position of a certain distance from the lensed end portion 70a. The grating 70e is provided in a core part 70c of the optical fiber 7 and the side surfaces of the core part 70c are covered with a clad part 70d.

The semiconductor light-emitting device 62 has a light-transmitting surface 62a and a light reflecting surface 62b. The grating 70e and the light-reflecting surface 4b form an optical cavity for the light generating module 60. The reflectivity of the light-reflecting surface 4b is greater than that of the light-transmitting surface 4a. The reflectivity of the light-transmitting surface 4a is faced to the light-receiving surface 8a of the semiconductor light-receiving device 8.

The optical operation of the module will be explained in reference to FIGS. 6A and 6B. Light F arrives at the light-receiving surface 8a from the light reflecting surface 62b of the semiconductor light-emitting device 62, and generates carriers in the light-receiving region 8b. Light G is supplied from the light-emitting surface 62a of the semiconductor light-emitting device 62, and is incident on the lensed end part 70a of the optical fiber 70. Some amount of light G passes through the grating 70e to become light I. Light I arrives at the other end 70b of the optical fiber 70, and is supplied to another device (not shown) through an optical coupling device 74. The remaining of the light G is reflected by the grating 70e to become light H. Light H arrives at the light-reflecting surface 62b through the lensed end 70a and the light-emitting surface 62a. Light H is reflected by the light-reflecting surface 62b, and is directed towards the grating 70e again.

The semiconductor light-emitting device 62 is mounted on the mount surface 10a of the first mounting member 10 through the second mounting member 16. One electrode of the semiconductor light-emitting device 62 is connected electrically to a power supply line through a bonding wire 48. The other electrode of the semiconductor light-emitting device 62 is connected electrically to the semiconductor driving element 6 through a bonding wire 46.

Referring FIG. 6B, the optical fiber 70 and the semiconductor light-emitting device 62 are aligned with a predetermined axis 44. The semiconductor light-emitting device 62 has an active layer 62c, which emits light in response to injected carriers. The active layer 62c is provided in a direction of a predetermined reference plane. The reference plane is determined so as to include the axis 44, as in the first embodiment. In FIG. 6B, the reference plane lies exactly on the axis 44 thereon. This reference plane divides a region provided by the housing 2 into two sections. The semiconductor driving element 6 is positioned in one of the sections. The light-receiving region 8b is positioned in the other section, and, preferably, the semiconductor light-receiving device 8 is positioned in the other section. In this arrangement, a straight line connecting the light-emitting region of the active layer 62c of the semiconductor light-emitting device 62 and the light-receiving region 8b does not intersect with the element surface 6a of the semiconductor driving element 6. This arrangement ensures that the semiconductor light-receiving device 8 is optically coupled well with the semiconductor light-emitting device 4, and makes it possible to position the semiconductor driving element 6 adjacent to the semiconductor light-emitting device 62, thereby providing a light generating module 1 capable of achieving high transmission rates.

Note that the structure of the light generating module shown in 6A and 6B can also be applied even to an optical fiber not provided with the grating 70e. In this light generating module, light from one end surface of the semiconductor light-emitting device is coupled through a lens to the optical fiber. The light from the other end surface of the semiconductor light-emitting device is incident on the monitoring light-receiving element. The one end of the semiconductor light-emitting device is provided with an AR coating layer, which makes it possible to strengthen light emitted from the semiconductor light-emitting device, and the other end thereof is provided with an HR coating layer. The reflectivity of the HR coating layer can be determined so that the monitoring light-receiving element can obtain an adequate sensitivity or an adequate monitoring current.

(Third Embodiment)

Figure 7A:
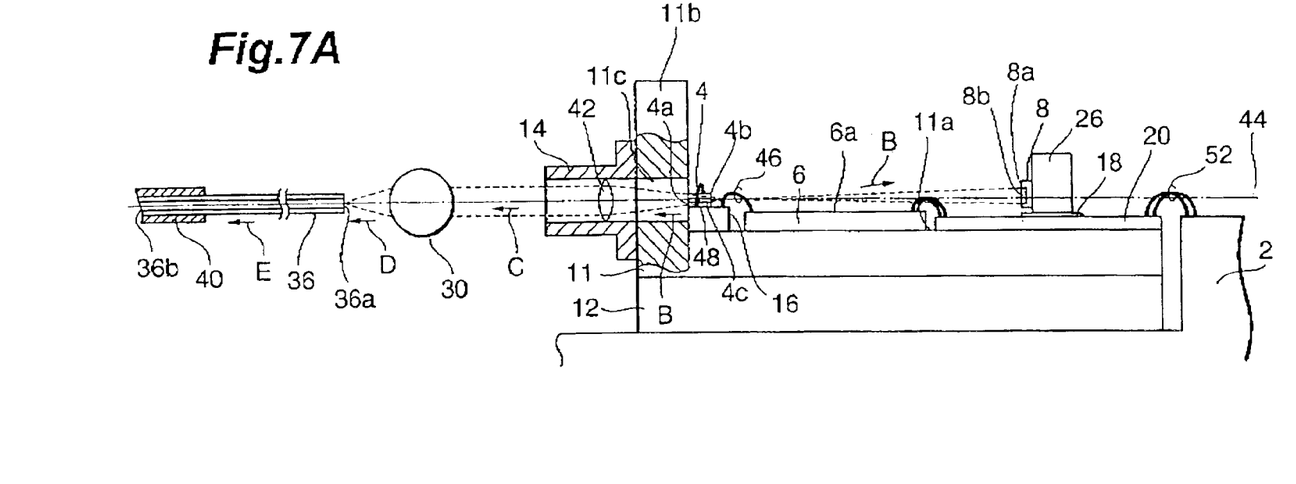
FIG. 7A is a side view showing electrical coupling and optical coupling between electronic and optical elements included in the light generating module according to still another embodiment of the present invention.

FIG. 7A shows a modification of the light generating module shown in FIG. 1. The light generating module according to this embodiment uses a first mounting member 11 instead of the first mounting member 10 in the light generating module 1. Remaining members aside from the mounting member 11 may be the same as those in the light generating module according to the first embodiment. The semiconductor light-emitting device 4, the semiconductor driving element 6, and the semiconductor light-receiving device 8 are mounted on a mounting surface 11a. A first lens holding member 14 is supported by a lens support member 11b.

As is shown in FIG. 7A, in the light generating module, an optical fiber 36, and lens 30, a lens 42, a semiconductor light-emitting device 4, and a semiconductor light-receiving device 8 are arranged on a predetermined axis 44. In this arrangement, a light B reflected from the light-reflecting surface of the semiconductor light-emitting device 4 propagates in a direction of the predetermined axis 44 and arrives at the semiconductor light-receiving device 8. The semiconductor light-emitting device 4 has an active layer 4c. The active layer 4c is provided to include a reference plane, and extends along said reference plane. The reference plane is determined such that the axis 44 is located thereon. In FIG. 7A, the axis 44 is completely on the reference plane. This reference plane divides a region provided by the housing 2 therein into first and second sections. The semiconductor driving element 6 is disposed in the first section.

Figure 7B:
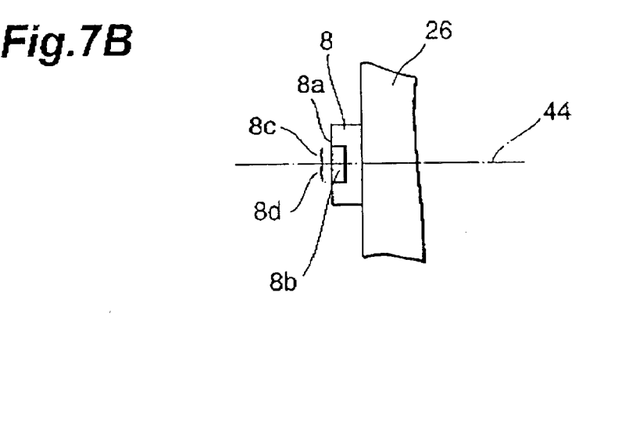
FIG. 7B is a view showing the relationship of the reference plane and the semiconductor light-receiving element.

In FIG. 7B, a light detection region 8b intersects with the reference plane, and is divided into a first portion 8d and a second portion 8c by the reference plane. The first portion 8d is positioned in the first section, and the second portion 8c is positioned in the second section. In this configuration, a straight line connecting the light-emitting region of the active layer 4c of the semiconductor light-emitting device 4 to the light detection region 8b does not intersect with the element surface 6a of the semiconductor driving element 6, thereby ensuring that the semiconductor light-receiving device 8 is optically coupled well with the semiconductor light-emitting device 4. In this configuration, the semiconductor driving element 6 and the semiconductor light-emitting device 4 can be arranged next to each other.

The principle of the present invention has been illustrated and described in the preferred embodiments thereof, and it is apparent to those skilled in the art that the present invention can be modified in arrangement and in detail without departing from the principle described above. For example, in the embodiments, a mini-DIL-type package can be used as the housing.

In addition, a region provided therein by the housing was divided into two individual sections by the reference plane. The semiconductor driving element was positioned in one of these sections, and the light-receiving region of the semiconductor light-receiving element is positioned in the other section. However, insofar as the light-reflecting surface of the active layer in the semiconductor light-emitting device can still be optically coupled to the light-receiving region of the semiconductor light-receiving element, the height of the semiconductor driving element can be changed. For example, the semiconductor light-emitting device, the semiconductor driving element, and the semiconductor light-receiving element may be arranged such that at least one line of straight lines connecting the light-emitting region of the active layer of the semiconductor light-emitting device 4 to the light detector region of the semiconductor light-receiving element does not intersect with the element surface of the semiconductor driving element. In this configuration, a part of light reflected from the light-reflecting surface of the active layer 4 can arrive at the light detection region of the semiconductor light-receiving element.

Furthermore, the first mounting member can be supported on a thermoelectric cooler, such as a Peltier element, instead of the support member. The thermoelectric cooler is connected to a lead terminal, and the thermoelectric cooler can control the temperature of the electronic elements that are mounted on the first mounting member, for example, the semiconductor light-receiving element, the semiconductor light-emitting device, and the semiconductor driving element.

The semiconductor driving element may have a first automatic power control circuit (APC) and a second automatic power control circuit (APC). The first automatic power control circuit is connected to a current source portion. The second automatic power control circuit is connected to a bias current circuit. The inputs of the first automatic power control circuit and second automatic power control circuit are connected to the outputs of a monitor signal amplifier circuit. The other terminal of the semiconductor light-receiving element (for example, the anode of a photodiode) is connected to the input of this amplifier circuit.

As explained in detail above, in the light generating modules in the embodiments, the driving element, the semiconductor light-emitting device and the monitoring light-receiving element are arranged such that the driving element is provided between the semiconductor light-emitting device and the monitoring light-receiving element. In the arrangement, the driving element can be provided adjacent to the semiconductor light-emitting device, such that a high transmission rate of 10 Gbps can be achieved. Therefore, a light generating module having a structure wherein the driving element is provided adjacent to the semiconductor light-emitting device is provided.

We therefore claim all modifications and variations coming within the spirit and scope of the following claims.

What is claimed is:

1. A light generating module comprising:
    a semiconductor light-emitting device;
    a monitoring light-receiving element provided so as to be optically coupled to said semiconductor light-emitting device;
    a driving element for driving said semiconductor light-emitting device; and
    a housing having first, second, and third regions arranged sequentially in a direction of a predetermined axis, said housing containing said semiconductor light-emitting device, said driving element and said monitoring light-receiving element therein;
    wherein said semiconductor light-emitting device is located in said first region, said driving element is located in said second region, and said monitoring light-receiving element is located in said third region.

2. The light generating module according to claim 1, further comprising:
    a first mounting member having first, second and third regions arranged sequentially in a direction of a predetermined axis; and
    a second mounting member, located in said third region of said first mounting member, having a support surface;
    wherein said monitoring light-receiving element is provided on said support surface;
    wherein said monitoring light-receiving element has a light-detecting region for detecting light;
    wherein said driving element is provided on said second region or said first mounting member;
    wherein said semiconductor light-emitting device is provided on said first region of said first mounting member;
    wherein said semiconductor light-emitting device has a pair of end surfaces and a active layer, said active layer extending from one of said pair of end surfaces to the other thereof;
    wherein a region provided by said housing is divided into first and second sections by a plane extending along said active layer;

wherein said monitoring light-receiving element has a light-detection region provided in said first section; and wherein said driving element is provided in said second section.

3. The light generating module according to claim 1, further comprising:

a first mounting member having first, second and third regions arranged sequentially in a direction of a predetermined axis; and a second mounting member having a support surface and provided in said third region of said first mounting member;

wherein said monitoring light-receiving element is provided on said support surface;

wherein said monitoring light-receiving element has a light-detecting region for detecting light;

wherein said driving element is provided on said second region of said first mounting member;

wherein said semiconductor light-emitting device is provided on sad first region of said first mounting member;

wherein said semiconductor light-emitting device has a pair of end surfaces and an active layer, said active layer extending from one of said pair of end surfaces to the other thereof;

wherein a region provided by said housing is divided into first and second sections by a plane extending along said active layer;

wherein said monitoring light-receiving element has a light-detection region including first and second portions, said first portion being provided in said first section, and said second portion being provided in said second section; and wherein said driving element is provided in said second section.

4. The light generating module according to claim 1, wherein said housing has a plurality of side walls;

wherein said monitoring light-receiving element is positioned between said driving element and one side wall of said plurality of side walls;

said light generating module further comprising a substrate provided between one side wall of said housing and said driving element; and wherein said substrate has transmission lines for transmitting modulation signals to said driving element, said transmission lines being connected electrically to said driving element.

5. The light generating module according to claim 4, wherein said transmission lines are provided on a surface of said substrate, said surface being made of AlN material.

6. The light generating module according to claim 4, wherein said transmission lines include microstrip lines.

7. The light generating module according to claim 4, wherein said transmission lines include coplanar lines.

8. The light generating module according to claim 4, wherein said second mounting member is provided on said substrate, and said second mounting member is located apart from said transmission lines.

9. The light generating module according to claim 1, further comprising an optical fiber having an end coupled optically to said semiconductor light-emitting device, said optical fiber being provided in a direction of said predetermined axis.

10. The light generating module according to claim 9, wherein said semiconductor light-emitting device includes an optical integrated laser element, said optical integrated laser element including an optical modulator and a semiconductor laser.

11. The light generating module according to claim 9, wherein said semiconductor light-emitting device includes a semiconductor laser element.

12. The light generating module according to claim 1, further comprising:

a first mounting member provided in said housing and having first, second, and third regions arranged sequentially in a direction of said predetermined axis; and a second mounting member provided in the third region of said first mounting member;

wherein said monitoring light-receiving element is provided in said third region of said first mounting member;

wherein said driving element is provided in said second region of first mounting member; and wherein said semiconductor light-emitting device is provided in said first region of first mounting member.

13. The light generating module according to claim 1, wherein said semiconductor light-emitting device has a pair of end surface;

wherein said second mounting member has a support surface, said monitoring light-receiving element being mounted on said support surface;

wherein said monitoring light-receiving element has a light detection region for detecting light; and wherein said light-detection region faces one of said pair of said end surface of said semiconductor light-emitting device.

14. The light generating module according to claim 13, further comprising an optical fiber optically coupled to the other of the pair of end surfaces of said semiconductor light-emitting device.

15. The light generating module according to claim 1, further comprising:

a first mounting member having first, second, and third regions arranged sequentially in a direction of said predetermined axis;

a substrate provided in said third region of said first mounting member;

a second mounting member provided in said substrate;

wherein said substrate has wirings thereon for transmitting modulation signals to said driving element, said wirings being connected electrically to said driving element;

wherein said monitoring light-receiving element is provided on said second mounting member so as to be provided on said wirings;

wherein said driving element is provided in said second region of said first mounting member; and wherein said semiconductor light-emitting device is provided in said first region of said first mounting member.

16. The light generating module according to claim 1, further comprising a substrate provided in said third region of said housing;

wherein said substrate has a pair of wirings thereon for transmitting differential modulation signals to said driving element, said pair of wirings being connected electrically to said driving element; and wherein said driving element processes said differential modulation signals to produce a single drive signal for said semiconductor light-emitting device.

17. The light generating nodule according to claim 16, further comprising a mounting member provided on said substrate, wherein said monitoring light-receiving module is mounted on said mounting member so as to be provided on said wirings.

18. The light generating module according to claim 1, further comprising a substrate having a primary surface, said substrate being provided in said third region of said housing;

wherein said primary surface of said substrate has a pair of wirings for transmitting modulation signals, to said driving element, said pair at wirings being connected electrically to a pair of electrodes on an element surface of said driving element, respectively; and wherein the height of said primary surface of said substrate is lower than the height of said element surface of said driving element.

19. The light generating module according to claim 1, wherein said housing has a plurality of wall portions and a plurality of lead terminals;

wherein said light generating module further comprises a substrate provided between said driving element and one of said plurality of wall portions, and wherein said substrate has a pair of wirings of transmitting differential modulation signals to said driving element, and each wiring has one end electrically connected to said driving element and another end electrically connected to one lead terminal of said lead terminals.

20. The light generating module according to claim 19, wherein said substrate has a pair of sides, one side being opposed to the other side;

wherein each wiring extends from one side of said pair of sides to the other side thereof; and wherein said one wide of said pair of edges faces said driving element end said other side thereof faces one wall portion of said wall portions, said wall portion having said plurality of lead terminals.

* * * * *